United States Patent
Hong et al.

(10) Patent No.: US 7,611,912 B2
(45) Date of Patent: Nov. 3, 2009

(54) UNDERLAYER FOR HIGH PERFORMANCE MAGNETIC TUNNELING JUNCTION MRAM

(75) Inventors: Liubo Hong, San Jose, CA (US); Cheng Horng, San Jose, CA (US); Mao-Min Chen, San Jose, CA (US); Ru-Yin Tong, San Jose, CA (US)

(73) Assignee: Headway Technologies, Inc., Milpitas, CA (US)

( * ) Notice: Subject to any disclaimer, the term of this patent is extended or adjusted under 35 U.S.C. 154(b) by 0 days.

(21) Appl. No.: 10/881,445

(22) Filed: Jun. 30, 2004

(65) Prior Publication Data

US 2006/0002184 A1 Jan. 5, 2006

(51) Int. Cl.
*H01L 21/8246* (2006.01)

(52) U.S. Cl. .................. 438/3; 257/E21.665; 365/171; 365/173

(58) Field of Classification Search .................. 438/3
See application file for complete search history.

(56) References Cited

U.S. PATENT DOCUMENTS

| | | | |
|---|---|---|---|
| 6,114,719 A | 9/2000 | Dill et al. | 257/295 |
| 6,205,052 B1 * | 3/2001 | Slaughter et al. | 365/173 |
| 6,473,336 B1 | 10/2002 | Nakajima et al. | 365/171 |
| 6,518,588 B1 | 2/2003 | Parkin et al. | 257/3 |
| 6,538,324 B1 | 3/2003 | Tagami et al. | 257/751 |
| 6,541,371 B1 * | 4/2003 | Ashtiani et al. | 438/627 |
| 6,562,634 B2 | 5/2003 | Bronner et al. | 438/3 |
| 6,580,140 B1 * | 6/2003 | Ballantine et al. | 257/467 |
| 6,635,546 B1 * | 10/2003 | Ning | 438/381 |
| 6,703,654 B1 | 3/2004 | Horng et al. | 257/295 |
| 6,704,220 B2 | 3/2004 | Leuschner | 365/173 |
| 6,744,608 B1 * | 6/2004 | Chen et al. | 360/324.2 |
| 6,972,468 B2 | 12/2005 | Motoyoshi | |
| 2002/0175386 A1 * | 11/2002 | Kim et al. | 257/423 |

(Continued)

FOREIGN PATENT DOCUMENTS

JP 2001303240 A * 10/2001

OTHER PUBLICATIONS

Computerized translation of Suzuki et al (JP 2001303240 A).*

(Continued)

*Primary Examiner*—Johannes Mondt
(74) *Attorney, Agent, or Firm*—Saile Ackerman LLC; Stephen B. Ackerman

(57) ABSTRACT

An MRAM structure is disclosed in which the bottom electrode has an amorphous TaN capping layer to consistently provide smooth and dense growth for AFM, pinned, tunnel barrier, and free layers in an overlying MTJ. Unlike a conventional Ta capping layer, TaN is oxidation resistant and has high resistivity to avoid shunting of a sense current caused by redeposition of the capping layer on the sidewalls of the tunnel barrier layer. Alternatively, the α-TaN layer is the seed layer in the MTJ. Furthermore, the seed layer may be a composite layer comprised of a NiCr, NiFe, or NiFeCr layer on the α-TaN layer. An α-TaN capping layer or seed layer can also be used in a TMR read head. An MTJ formed on an α-TaN capping layer has a high MR ratio, high Vb, and a RA similar to results obtained from MTJs based on an optimized Ta capping layer.

3 Claims, 3 Drawing Sheets

U.S. PATENT DOCUMENTS

2003/0168684 A1* 9/2003 Pan et al. ............... 257/296

OTHER PUBLICATIONS

Farooq et al, "Tantalum nitride as a diffusion barrier between Pd2Si or CoSi2", J. Appl. Phys. 65(8), 3017-3022 (Apr. 1989).*

Nakamura et al, "Oxidation-Resistant Amorphous TaN Barrier for MIM-Ta2O3 Capacitors in Giga-Bit DRAMs", 2001 Symp. on VLSI Technology Digest of Technical Papers, Paper 4B-1, pp. 39-40).*

"Knovel Critical Tables", $2^{nd}$ Edition (2008)—"Thermodynamic Properties of Inorganic Structures": tantalum nitride (obtained from "http://www.knovel/com".*

Co-pending U.S. Patent App., "A Novel Buffer (Seed) Layer for Making a High-Performance Magnetic Tunneling Junction MRAM", U.S. Appl. No. 10/849,310, filed May 19, 2004, same assignee.

Co-pending U.S. Patent App., "A Novel Structurel Method to Fabricate a High-Performance Magnetic Tunneling Junction MRAM", U.S. Appl. No. 10/844,171, filed May 12, 2004, assigned to the same assignee.

"Magnetic tunnel junction pattern technique," Chen et al., Jrnl. of Applied Physics, vol. 93, No. 10, May 15, 2003, pp. 8379-8381.

Translation of Office Action—JP, May 12, 2009, Headway Technologies, Inc.

"A 0.18-um logic-based MRAM technology for high performance nonvolatile memory applications," by A.R. Sitaram et al., Semiconductor Fabtech—19th Edition, Wafer Processing, Mar. 2003, pp. 103, 105, 106 and 108.

*Handbook of Thin Film Technology*, Edited by Leon I. Maissel And Reinhard Glang, International Business Machines Corporation, Components Division, East Fishkill Facility, Hopewell Junction, N.Y., USA, Copyright 1970 by McGraw-Hill, Inc., pp. 18-3 to 18-13.

* cited by examiner

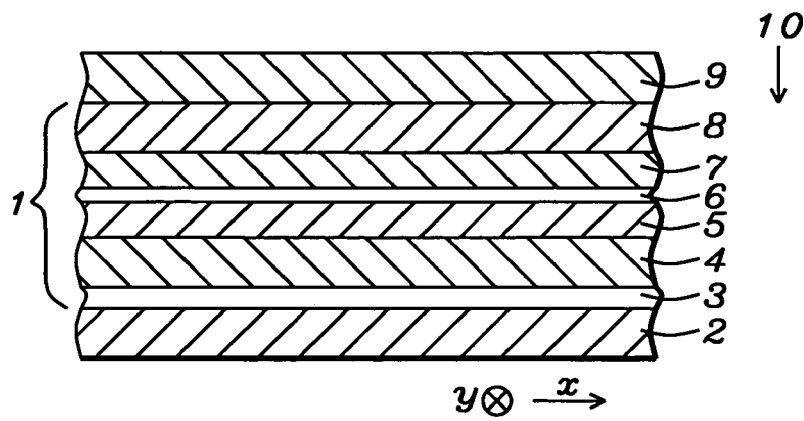
FIG. 1 – Prior Art
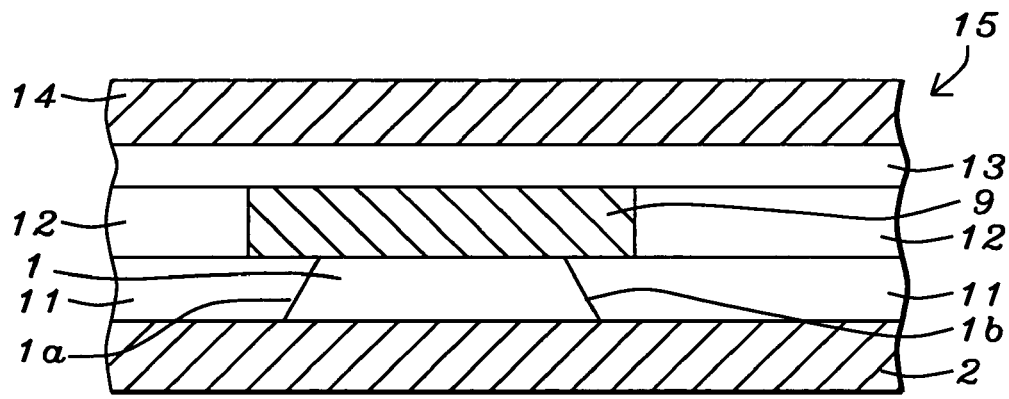
FIG. 2 – Prior Art
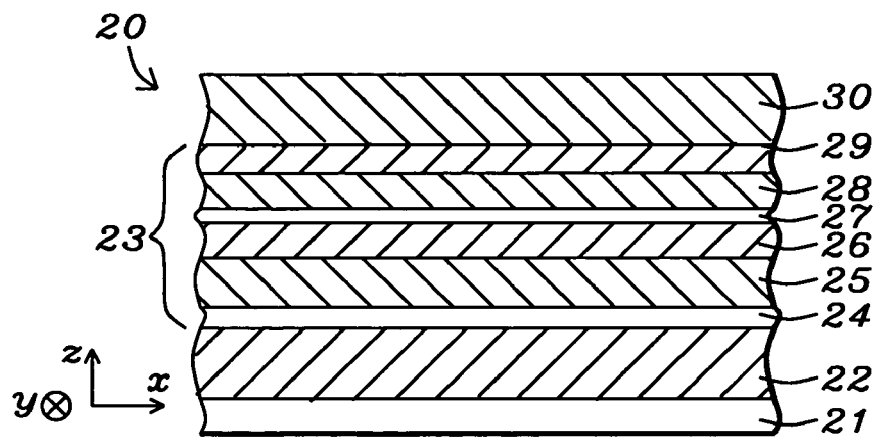
FIG. 3 – Prior Art

UNDERLAYER FOR HIGH PERFORMANCE MAGNETIC TUNNELING JUNCTION MRAM

RELATED PATENT APPLICATIONS

This application is related to the following: Ser. No. 10/844,171, filing date May 12, 2004; and Ser. No. 10/849,310, filing date May 19, 2004; all assigned to a common assignee.

FIELD OF THE INVENTION

The invention relates to a high performance Magnetic Tunneling Junction (MTJ) element and a method for making the same, and more particularly, to a seed layer for the MTJ element that can also serve as the capping layer for a bottom electrode in an MRAM device.

BACKGROUND OF THE INVENTION

A magnetic random access memory (MRAM) device is generally comprised of a cross point design in which an array of parallel second conductive lines crosses over an array of parallel first conductive lines, and an MTJ element is formed between a first conductive line and second conductive line at each crossover point. A first conductive line may be a word line while a second conductive line is a bit line or vice versa. Alternatively, a first conductive line may be a bottom electrode that is a sectioned line while a second conductive line is a bit line (or word line). There are typically other structures and devices including transistors and diodes below the array of first conductive lines and sometimes one additional conductive layer comprised of an array of second word lines or second bit lines above the second conductive lines.

In FIG. 1, an MTJ element 1 is shown that is based on a tunneling magneto-resistance (TMR) effect wherein a stack of layers has a configuration in which two ferromagnetic layers are separated by a thin non-magnetic dielectric layer. In an MRAM device, the MTJ element is formed between a bottom electrode 2 that may be a sectioned first conductive line and a top electrode 9 which is a second conductive line. The bottom electrode 2 typically has a seed layer/conductive layer/capping layer configuration such as Ta/Cu/Ta or NiCr/Ru/Ta. The bottom layer 3 in the MTJ element 1 is typically comprised of one or more seed layers that may be NiFeCr, NiFe, NiCr, Ta/NiFeCr, Ta/NiFe or Ta/NiCr which promote a <111> lattice orientation in overlying layers. Next, an antiferromagnetic (AFM) pinning layer 4 is formed that is MnPt or IrMn, for example. There is a ferromagnetic "pinned" layer 5 on the AFM layer 4 that may be a composite of multiple layers including CoFe layers. The thin tunnel barrier layer 6 above the pinned layer 5 is generally comprised of a dielectric material such as $Al_2O_3$ and may have multiple layers. A ferromagnetic "free" layer 7 which may be another composite layer that includes one or both of CoFe and NiFe is formed on the tunnel barrier layer 6. At the top of the MTJ stack is one or more cap layers 8. This MTJ stack has a so-called bottom spin valve configuration. Alternatively, an MTJ stack may have a top spin valve configuration in which a free layer is formed on a seed layer followed by sequentially forming a tunnel barrier layer, a pinned layer, AFM layer, and a cap layer.

The pinned layer 5 has a magnetic moment that is fixed in the x direction by exchange coupling with the adjacent AFM layer 4 that is also magnetized in the x direction. The free layer 7 has a magnetic moment that is either parallel or anti-parallel (along the x axis) to the magnetic moment in the pinned layer. The tunnel barrier layer 6 is so thin that a current through it can be established by quantum mechanical tunneling of conduction electrons. The magnetic moment of the free layer may change in response to external magnetic fields and it is the relative orientation of the magnetic moments between the free and pinned layers that determines the tunneling current and therefore the resistance of the tunneling junction. When a sense current 10 is passed from the top electrode 9 to the bottom electrode 3 in a direction perpendicular to the MTJ layers, a lower resistance is detected when the magnetization directions of the free and pinned layers are in a parallel state ("1" memory state) and a higher resistance is noted when they are in an anti-parallel state or "0" memory state.

In a read operation, the information stored in an MRAM cell is read by sensing the magnetic state (resistance level) of the MTJ element through a sense current flowing top to bottom through the cell in a current perpendicular to plane (CPP) configuration. During a write operation, the information is written to the MRAM cell by changing the magnetic state in the free layer to an appropriate one by generating external magnetic fields as a result of applying bit line and word line currents in two crossing conductive lines, either above or below the MTJ element. In certain MRAM architectures, the top electrode or the bottom electrode participates in both read and write operations.

One indication of good device performance is a high magnetoresistive (MR) ratio which is dR/R where R is the minimum resistance of the MTJ element and dR is the maximum change in resistance observed by changing the magnetic state of the free layer. In order to achieve desirable properties such as a high dR/R value and a high breakdown voltage (Vb), it is necessary to have a smooth tunnel barrier layer that is promoted by a smooth and densely packed growth, such as a <111> texture for the AFM and pinned layers. As mentioned previously, the desired texture in the AFM and pinned layers is generally provided by a seed layer comprised of Ta, NiCr, NiFeCr, or the like. However, the growth of a Ta layer and NiCr/NiFeCr layer are highly sensitive to starting surface conditions. For instance, Ta can be either a β-phase or an α-phase layer. A NiCr or NiFeCr buffer layer reproducibly has a smooth <111> texture when grown on an amorphous $Al_2O_3$ layer. However, depending on the Ta structure, NiCr or NiFeCr seed layer growth on a Ta layer is sometimes inconsistent which leads to inconsistent device performance. A Ta layer has been used as a seed layer to promote <111> growth in an MTJ stack in U.S. Pat. No. 6,114,719. In U.S. Pat. No. 6,518,588, a Ta seed layer is formed on a lateral electrode made of TaN which is formed on a stud that is connected to a word line in an MRAM structure.

Referring to FIG. 2, the MTJ 1 element is shown in an MRAM cell 15 that has a bottom electrode 2 and a top electrode 9 as described previously. The MTJ element 1 is coplanar with and formed in a first insulation layer 11 while the top electrode 9 is coplanar with a second insulation layer 12 formed on the first insulation layer. There is a third insulation layer 13 between the top electrode 9 and an overlying third conductive layer 14 that can be a word line or bit line. From a top-down perspective (not shown), a plurality of MTJ elements is formed in an array between multiple rows of bottom electrodes and multiple columns of top electrodes.

Another concern with the variable phase (α or β) of a Ta layer is that the β-structure formed on an amorphous substrate such as $Al_2O_3$ is "tetragonal" and has a resistivity of about 180 to 200 μohms-cm while an α-structure formed on a body centered cubic (bcc) seed layer like Cr, W, or TiW has a lower resistivity of around 25 to 50 μohms-cm. Unfortunately, in the case of the commonly used NiCr/Ru/Ta bottom electrode configuration, the Ta layer is grown with a low resistivity α-structure. During the formation of the MTJ element 1, a mask (not shown) is formed on the cap layer 8 and unwanted regions of the MTJ stack of layers are etched away. As a result, some of the Ta capping layer in the bottom electrode 2 is redeposited along the sidewalls 1a, 1b of the MTJ element including the sides of the tunnel barrier layer. The highly conductive redeposited Ta material tends to shunt a sense current around the tunneling barrier in the MTJ element 1 and causes a major device issue. Thus, it is desirable to have a high resistivity layer as the capping layer on the bottom electrode 2.

Yet another concern with a conventional Ta capping layer on a bottom electrode is that Ta easily oxidizes and the oxide on a Ta capping layer must be removed by an in-situ preclean process such as a sputter etch or ion beam etch before the MTJ stack is deposited in order to provide good electrical contact. Besides the extra process time required for a heavy preclean, the growth of an MTJ seed layer such as NiCr is found to be sensitive to the Ta surface condition after the preclean step. Therefore, it is desirable for the bottom electrode to have a capping layer that provides consistent growth for an MTJ seed layer and does not require a heavy preclean.

In addition to MRAM applications, an MTJ element with a thinner tunnel barrier layer and a very low resistance x area (RA) value may be employed as a magnetoresistive (MR) sensor in a TMR magnetic read head. Referring to FIG. 3, a portion of a TMR read head 20 on a substrate 21 is shown from the plane of an air bearing surface (ABS). There is an MTJ element 23 formed between a bottom lead 22 which is a bottom shield (S1) and a top lead 30 which is the upper shield (S2). The MTJ element 23 is comprised of a seed layer 24, an AFM layer 25, a pinned layer 26, a tunnel barrier layer 27, a free layer 28, and a cap layer 29 which are sequentially formed on the bottom lead 22 and have a composition and function similar to the corresponding layers in the MTJ element 1 described previously. Typically, the bottom lead 22 and top lead 30 have a NiFe/Ta and Ru/Ta/NiFe (~2 μm) configurations, respectively, in which the top Ta layer in the bottom lead is subject to the same requirements as a Ta capping layer on a bottom electrode in an MRAM cell. Likewise, the concern about consistent smooth growth in the overlying MTJ stack, Ta oxidation, and Ta redeposition on the sidewalls of the tunnel barrier layer also applies in a TMR sensor device. A read operation involves moving the read head along the ABS in the z direction over a recording medium which causes an external magnetic field to influence the magnetization direction of the free layer.

In U.S. Pat. No. 6,703,654, an MRAM with a bottom electrode comprised of a NiCr/Ru/NiCr configuration is disclosed. A high melting point metal such as Ru, Rh, or Ir is used as the middle conductive layer in the bottom electrode to facilitate smaller grain sizes that result in a smoother electrode surface. Improved performance in the overlying MTJ element is also observed.

U.S. Pat. No. 6,538,324 indicates that a TaN layer can be either crystalline or amorphous depending on plasma deposition conditions. A crystalline TaN film has better adhesion to copper but amorphous TaN is a better diffusion barrier layer. A copper layer is formed on a bilayer that has a crystalline TaN upper layer and an amorphous TaN bottom layer.

A TaN barrier layer is formed between a cell plate and a TMR element to prevent metal diffusion in U.S. Pat. No. 6,473,336. However, the '336 patent does not disclose whether the TaN is amorphous or crystalline and teaches that a seed layer such as Au, Pt, Ta, Ti, or Cr is needed to control crystal orientation and crystallinity in the MTJ stack.

In U.S. Pat. No. 6,704,220, a first magnetic layer in a memory cell may include a seed layer comprised of TaN to prevent corrosion of an underlying first conductive line. However, the '220 patent does not teach that the TaN layer must be amorphous or provide a method of forming the TaN layer.

SUMMARY OF THE INVENTION

One objective of the present invention is to provide a capping layer for the bottom electrode of an MRAM cell or for the bottom lead (S1) in a TMR read head that promotes consistent growth of a subsequently formed MTJ element, has a high resistivity, and does not require a heavy preclean before MTJ deposition.

A further objective of the present invention is to provide an amorphous seed layer in an MTJ element that consistently enables the smooth and densely packed growth of subsequent layers including an AFM layer, a pinned layer, and a tunnel barrier layer.

A still further objective of the present invention is to provide a method of forming an MRAM cell structure according to the first and second objectives.

According to the present invention, these objectives are achieved by providing a substrate on which an MRAM cell is to be formed. A bottom electrode with a seed layer/conductive layer/capping layer configuration is formed on the substrate. An important feature is that the capping layer is comprised of amorphous TaN hereafter referred to as α-TaN that promotes a smooth and densely packed growth in subsequently formed MTJ layers. The α-TaN layer is deposited by a reactive sputtering method involving an $Ar/N_2$ plasma, preferably using a DC or RF magnetron. The nitrogen content in the resulting α-TaN layer is between 25 and 35 atomic % and preferably 30 atomic %. In a preferred embodiment, the bottom electrode has a NiCr/Ru/α-TaN or NiCr/Cu/α-TaN configuration.

An MTJ element consisting of a stack of layers is formed on the bottom electrode. In one embodiment, the MTJ element has a bottom spin valve configuration in which a seed layer, AFM layer, synthetic anti-parallel (SyAP) pinned layer, tunnel barrier layer, free layer, and a cap layer are sequentially formed. The seed layer is preferably NiCr and the AFM layer is one of MnPt or IrMn. The SyAP pinned layer has a Ru coupling layer sandwiched between two CoFe layers. An oxidized Al (AlOx) layer is employed as the tunnel barrier layer. Above the tunnel barrier layer is a free layer made of a NiFe layer or a NiFe layer on a CoFe layer. The top layer in the MTJ stack is preferably a Ru or Ta layer. All of the layers in the MTJ stack are formed by sputtering or ion beam deposition (IBD). Oxidation of the Al layer is accomplished by a natural oxidation (NOX) or radical oxidation (ROX) method. A conventional sequence may then be followed to define the shape of the MTJ element, form a first insulation layer adjacent to the MTJ element, and form a top electrode on the MTJ element.

In a second embodiment, the bottom electrode has a Ta/Cu, NiCr/Cu, or NiCr/Ru configuration and no capping layer. The seed layer in the MTJ stack is preferably comprised of an α-TaN layer as described in the first embodiment. Optionally, a composite seed layer with an α-TaN/NiCr, α-TaN/NiFe, or α-TaN/NiFeCr configuration is formed on the bottom electrode. The remaining layers in the MTJ stack are the same as described in the first embodiment.

In a third embodiment, the present invention is a TMR read head in which an MTJ element based on a TMR effect serves as a sensor and is formed between a bottom shield (S1) and an upper shield (S2). The bottom shield preferably has a NiFe/α-TaN configuration in which the amorphous TaN capping layer promotes a smooth and densely packed growth in the overlying MTJ layers. In one aspect, the MTJ element has the same composition as previously described in the first embodiment.

In a fourth embodiment, the bottom shield in a TMR read head is made of NiFe with no capping layer. A seed layer comprised of α-TaN, α-TaN/NiCr, α-TaN/NiFe, or α-TaN/NiFeCr is formed as the bottom layer in the MTJ element on the bottom shield. The remaining layers in the MTJ element are the same as described in the previous embodiments.

BRIEF DESCRIPTION OF THE DRAWINGS

FIG. 1 is a cross-sectional view showing a conventional MTJ element which is formed between a bottom electrode and a top electrode in an MRAM structure.

FIG. 2 is an enlarged view of the MRAM structure in FIG. 1 that depicts sloped sidewalls on the MTJ element and insulation layers adjacent to the top electrode.

FIG. 3 is a cross-sectional view of a conventional MTJ element formed between bottom and upper shields and which serves as a sensor in a TMR read head

DETAILED DESCRIPTION OF THE INVENTION

The present invention is an α-TaN layer which is integrated into a magnetic tunneling junction (MTJ) device. The α-TaN layer is incorporated in an MRAM structure and in a TMR read head and provides smooth and densely packed growth in overlying MTJ layers. The drawings are provided by way of example and are not intended to limit the scope of the invention. Although the drawings depict a bottom spin valve structure, the present invention also applies to a top spin valve structure or a dual spin valve configuration in an MTJ element as appreciated by those skilled in the art.

Figure 4:
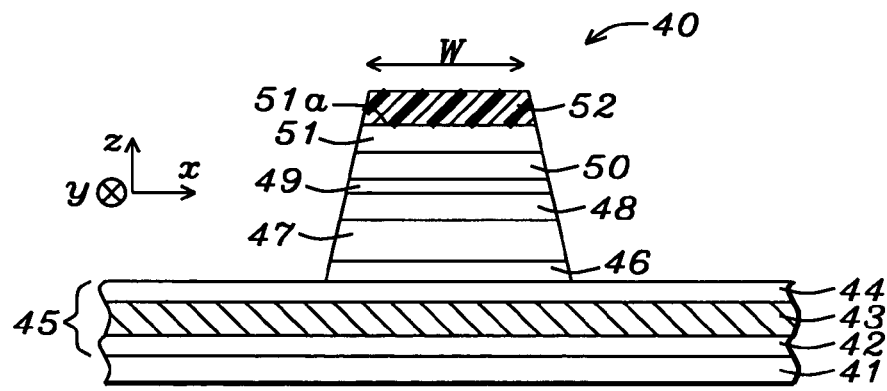
FIG. 4 is a cross-sectional view of a partially formed MRAM structure in which an MTJ element is formed on a bottom electrode that has an α-TaN capping layer according to the first embodiment of the present invention.

An MRAM structure formed according to a first embodiment of the present invention will now be described. Referring to FIG. 4, a partially completed MRAM structure 40 is shown that includes a substrate 41 which may be silicon or another semiconductor substrate used in the art that typically contains other structures and devices such as transistors and diodes. A bottom electrode 45 which is a composite layer having a seed layer/conductive layer/capping layer configuration is formed on the substrate 41 and is typically coplanar with an insulation layer (not shown).

It is understood that the MRAM structure is part of an MRAM array in which multiple bottom electrodes are formed in a first conductive layer and multiple top electrodes such as parallel bit lines or word lines are formed in a second conductive layer above the bottom electrodes. An MTJ element is formed between a first and second conductive layer at each location where a top electrode crosses over a bottom electrode. The bottom electrode 45 may be a sectioned line, for example, that has a rectangular shape in the x,y plane and a thickness in the z direction. Alternatively, the bottom electrode is a bit line (or word line) that is aligned orthogonally to the top electrode which is a word line (or bit line). An insulation layer separates bottom electrodes from each other.

In one embodiment, the bottom electrode 45 has a NiCr/Ru/α-TaN or NiCr/Cu/α-TaN configuration in which a seed layer 42 formed on the substrate 41 is preferably made of NiCr with a thickness of about 40 to 100 Angstroms. Above the seed layer 42 is a conductive layer 43 which has a thickness between about 50 and 1000 Angstroms and is preferably comprised of Ru or Cu. As noted in U.S. Pat. No. 6,703,654 assigned to Headway Technologies, Inc., which is herein incorporated by reference in its entirety, other high melting point metals such as Ir and Rh that have a small grain size and a smooth surface may be used as the conductive layer 43. The seed layer 42 and conductive layer 43 are typically formed by a sputtering or ion beam deposition (IBD) method as is understood by those skilled in the art. A key component of the bottom electrode is the capping layer 44 which is an α-TaN layer that is deposited on the conductive layer by a reactive sputtering process in which a Ta target is bombarded by a plasma that includes a nitrogen containing gas such as an Ar/$N_2$ mixture. In one aspect, the deposition is performed using a DC or RF magnetron. As a result, an α-TaN capping layer 44 with a thickness from about 50 to 400 Angstroms and a nitrogen content of between 25 and 35 atomic %, and preferably 30% is formed.

Alternatively, the bottom electrode 45 may have a Ta/Cu/α-TaN configuration in which a Ta seed layer 42 and a conductive layer 43 made of Cu are sequentially deposited on the substrate 41 by a sputtering or IBD method. In this case, the α-TaN capping layer 44 also has a thickness of about 50 to 400 Angstroms and is formed by the previously described method.

There are several advantages realized by replacing a conventional Ta capping layer with the α-TaN capping layer of the present invention. First, α-TaN does not oxidize like Ta and therefore a heavy preclean step is not necessary before an MTJ stack of layers is deposited on the bottom electrode. Secondly, an α-TaN layer consistently provides smooth and densely packed growth in subsequently grown MTJ layers. Other advantages will become apparent during a further description of the present invention.

An MTJ stack of layers is now formed on the bottom electrode 45. It is understood that the MTJ stack of layers may be formed in the same process tool as the bottom electrode. For instance, the bottom electrode 45 and MTJ layers can be formed in an Anelva 7100 system or the like which includes ultra high vacuum DC magnetron sputter chambers and oxidation chambers. Typically, the sputter deposition process involves an argon sputter gas and each sputter chamber has multiple targets which are low pressure discharge cathodes. In one aspect, the bottom electrode 45 and overlying MTJ layers may be formed after a single pump down of the sputter deposition system to enhance throughput.

In one embodiment, the MTJ stack of layers is disposed on the bottom electrode 45 by sequentially forming a seed layer, AFM layer, SyAP pinned layer, tunnel barrier layer, free layer, and a capping layer. The seed layer 46 has a thickness of about 40 to 100 Angstroms and is preferably comprised of NiCr with a Cr content of about 35 to 45 atomic % although NiFe or NiFeCr are also useful seed layers. Since the seed layer 46 is grown on an α-TaN capping layer 44, a smooth and dense <111> seed layer structure results. The inventors have previously practiced a process in which a NiCr seed layer is deposited on an amorphous Ta layer as described in Headway patent application HT03-025/031 which is herein incorporated by reference. A smooth and dense seed layer 46 is critical for smooth and densely packed growth in subsequently formed MTJ layers. The AFM layer 47 is preferably made of MnPt with a thickness of about 80 to 200 Angstroms although IrMn having a thickness from about 50 to 100 Angstroms is also acceptable.

The SyAP pinned layer 48 preferably has an AP2/Ru/AP1 configuration. The AP2 layer is formed on the AFM layer 47 and is preferably comprised of CoFe with a thickness of about 15 to 30 Angstroms. The magnetic moment of the AP2 layer (not shown) is pinned in a direction anti-parallel to the magnetic moment of the AP1 layer. The slight difference in thickness between the AP2 and AP1 layers produces a small net magnetic moment for the SyAP pinned layer 48. Exchange coupling between the AP2 layer and the AP1 layer is facilitated by a coupling layer that is preferably comprised of Ru with a thickness of about 7.5 Angstroms. In one embodiment, the AP1 layer is comprised of CoFe with a composition of about 25 to 50 atomic % Fe and a thickness of 10 to 25 Angstroms. Optionally, the AP1 layer may be a composite layer that includes a thin nano-oxide layer (NOL) such as FeTaO or CoFeO sandwiched between CoFe layers. The nano-oxide layer is employed to increase smoothness of the AP1 layer.

Above the SyAP pinned layer 48 is formed a thin tunnel barrier layer 49 which is an oxidized Al layer that has an oxygen content which is close to a $Al_2O_3$ stoichiometry and is hereafter referred to as an $AlO_x$ layer. Initially, a 7 to 10 Angstrom thick Al layer is deposited on the SyAP pinned layer 48 and is subsequently oxidized by an in-situ radical oxidation (ROX). An example of a ROX process that involves a plasma oxidation process in which a grid-like cap is placed between an upper ionizing electrode and a substrate surface (Al layer) in an oxidation chamber is described in a related Headway patent application HT03-022 which is herein incorporated by reference. The resulting $AlO_x$ layer has a thickness of about 10 to 15 Angstroms and has excellent smoothness and uniformity because of the smooth and densely packed seed layer 46 grown on the α-TaN capping layer 44.

The free layer 50 formed on the tunnel barrier layer 49 is preferably a NiFe layer with a thickness of between 25 and 60 Angstroms. There is a capping layer 51 comprised of Ru or Ta formed on the free layer 50. Typically, the capping layer 51 has a thickness from about 60 to 250 Angstroms. Because of the integration of an α-TaN layer as the capping layer 44 in the bottom electrode 45, a smooth and densely packed crystal structure is subsequently formed for the MTJ stack of layers.

An MTJ element with sidewalls and a top surface 51a is fabricated by first coating and patterning a photoresist layer 52 that has a width w on the capping layer 51. Next, the photoresist layer 52 is employed as an etch mask during an etch sequence that removes regions of the MTJ stack of layers 46-51 which are not protected by the etch mask. As a result, an MTJ element is formed that typically has sloped sidewalls in which the capping layer 51 has a width w and the seed layer 46 has a width greater than w. Note that the α-TaN capping layer 44 is exposed during the etch process and in some cases may be partially etched and redeposited along the sidewalls of the MTJ element. When a conventional Ta capping layer is used in the bottom electrode, the etch process that defines the MTJ element can redeposit Ta on the sides of the tunnel barrier layer and shunt a sense current around the tunnel barrier layer which causes serious device problems. However, the α-TaN capping layer 44 has a high resistivity and a redeposition of TaN on the sides of the tunnel barrier layer 49 is not a concern since the sense current $I_s$ (FIG. 5) will not be shunted around the tunnel barrier.

Figure 5:
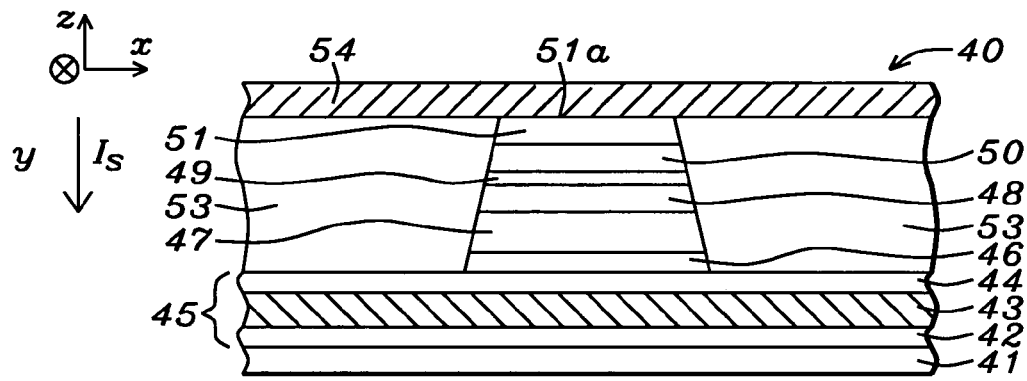
FIG. 5 is a cross-sectional view of the MRAM structure in FIG. 4 after the photoresist mask is removed and an insulation layer is formed adjacent to the MTJ element and a top electrode is formed on the top surface of the MTJ element.

Referring to FIG. 5, an insulation layer 53 is formed on the α-TaN capping layer 44 and adjacent to the MTJ sidewalls by a conventional method that may involve depositing an insulation material and then planarizing the resulting insulation layer 53 to be coplanar with the top surface 51a of the MTJ element.

The next step in fabricating the MRAM structure 40 is to form a top electrode 54 on the insulation layer 53 that contacts the top surface 51a of the MTJ element. The top electrode is aligned in a direction perpendicular to that of the bottom electrode. For example, the bottom electrode 45 may be a bit line (or word line) oriented along the x axis while the top electrode 54 is a word line (or bit line) oriented along the y axis. Optionally, the bottom electrode is a sectioned line with a rectangular shape. Furthermore, the top electrode 54 may be comprised of more than one layer such as a conductive layer formed on a diffusion barrier layer as appreciated by those skilled in the art.

Figure 6:
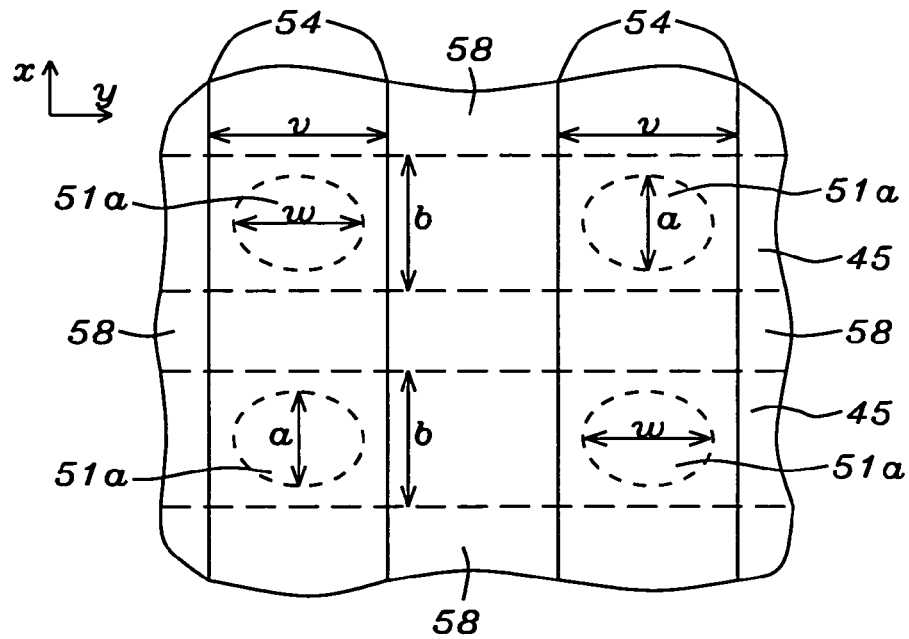
FIG. 6 is a top view of the MRAM structure in FIG. 5 that shows an MTJ element formed between top electrodes and bottom electrodes at crossover points.

Referring to FIG. 6, a top view of an MRAM array is shown that is comprised of four MRAM cells, four MTJ elements, two bottom electrodes 45 and two top electrodes 54. In the exemplary embodiment, the bottom electrodes 45 are word lines that have a length oriented in the y direction and a width b along the x direction while the top electrodes 54 are bit lines that have a length in the x direction and a width v in the y direction. It is understood that the top electrodes 54 are coplanar with and separated by a second insulation layer 58 that may contain the same dielectric material as in the insulation layer (not shown) that is coplanar with the MTJ elements. The top surface 51a of each MTJ element as well as underlying MTJ layers have an elliptical shape that has a length w along a long axis that is typically the easy axis and a width a along a short axis. The width v of a top electrode 54 may be larger than the length w and the width b of a bottom electrode 45 may be larger than the width a of an MTJ element.

An experiment was conducted to determine the performance of an MTJ element formed over a bottom electrode that has an α-TaN capping layer. The results are compared with those from a similar MRAM structure except that a Ta capping layer for the bottom electrode is used that has received a special preclean treatment to avoid a growth inconsistency problem and to remove a tantalum oxide growth as discussed previously. The results in Table 1 indicate that even though the NiCr/Ru/α-TaN bottom electrode configuration of the present invention is not optimized, a similar performance in terms of MR ratio (dR/R), RA and RA sigma, and breakdown voltage is achieved as when an optimized NiCr/Ru/Ta bottom electrode is used in the MRAM structure. The data in Table 1 confirms that an α-TaN capping layer formed according to the present invention does provide good growth in the overlying MTJ stack of layers. Thus, the α-TaN capping layer described herein provides a combination of properties including high resistivity, oxidation resistance, and good MTJ growth promotion that has not been achieved in any prior art bottom electrode capping layer.

TABLE 1

Magnetic Properties of Bottom Electrode/MTJ Stack Configurations

| Sample | Bottom electrode// MTJ stack | dR/R (%) | RA (ohm-um$^2$) | RA sigma | Vb (Volts) | V50 (mV) |
|---|---|---|---|---|---|---|
| 1 | NiCr/Ru/Ta// NiCr/MP/CoFe/ Ru/CoFe/AlO$_x$/ CoFe/NiFe/Ru | 48 | 3568 | 10% | 1.63 | 703 |
| 2 | NiCr/Ru/α-TaN// NiCr/MP/CoFe/ Ru/CoFe/AlO$_x$/ CoFe/NiFe/Ru | 45 | 3628 | 11% | 1.61 | 639 |

Figure 7:
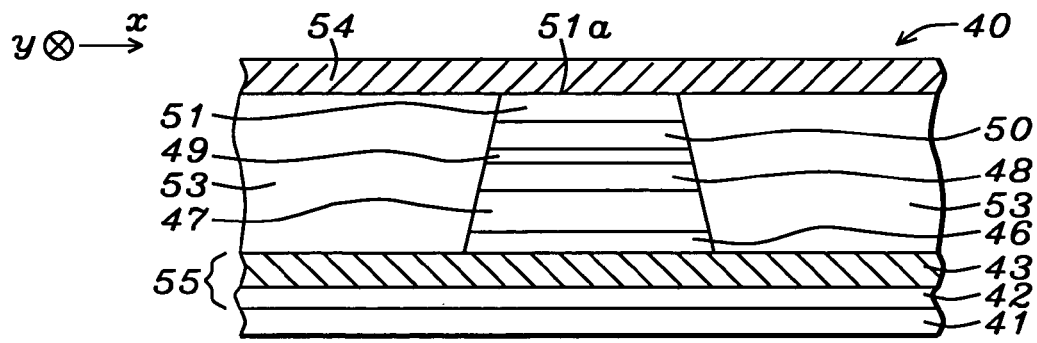
FIG. 7 is a cross-sectional view of an MTJ element in an MRAM structure that has an α-TaN seed layer according to a second embodiment of the present invention.

In a second embodiment depicted in FIG. 7, an MRAM structure 40 is shown that has an MTJ element sandwiched between a bottom electrode 55 and a top electrode 54. The MRAM structure 40 is fabricated by a method similar to the process sequence used to form the MRAM structure in the first embodiment. In this case, the bottom electrode does not require a capping layer and the seed layer in the MTJ element is comprised of α-TaN.

Referring to FIG. 7, the bottom electrode 55 is comprised of a seed layer 42 and an overlying conductive layer 43. The seed layer 42 and conductive layer 43 have a thickness and composition as previously described. For example, the bottom electrode 55 may have a NiCr/Ru, NiCr/Cu, or a Ta/Cu configuration. It should be noted that a Ru or Cu surface is easier to clean than a conventional Ta capping layer on a bottom electrode. Other bottom electrode configurations that include a capping layer are acceptable although a capping layer for the bottom electrode is not necessary in this embodiment. The second embodiment affords a greater flexibility in selecting a bottom electrode composition because the subsequently formed α-TaN seed layer isolates the MTJ stack from the influence of the bottom electrode 55.

An MTJ stack of layers is disposed on the bottom electrode 55 by sequentially forming a seed layer 56, AFM layer 47, SyAP pinned layer 48, tunnel barrier layer 49, free layer 50, and a capping layer 51. A key feature is that the seed layer 56 is comprised of an α-TaN layer formed by the previously described method. The α-TaN layer has a thickness of about 50 to 400 Angstroms and serves to promote a smooth and dense growth in overlying MTJ layers. One advantage of an α-TaN seed layer compared with a conventional Ta seed layer is that the α-TaN seed layer consistently provides smooth and dense growth in overlying MTJ layers while a Ta seed layer may be formed of different phases and is known to cause inconsistent growth in subsequently deposited MTJ layers. Alternatively, the seed layer 56 may be a composite layer having a bottom α-TaN layer with a thickness from 50 to 400 Angstroms and an upper NiCr, NiFe, or NiFeCr layer having a thickness between about 40 and 100 Angstroms.

The remaining layers in the MTJ stack have the same composition and thickness as described in the first embodiment. As a result of a photoresist patterning and etching sequence, an MTJ element is formed with sloped sidewalls and a top surface 51a. Typically, the width of seed layer 56 is greater than the width of the capping layer 51. An insulation layer 53 is formed adjacent to the MTJ element and is preferably coplanar with the top surface 51a. There is a top electrode 54 formed on the insulation layer 53 which also contacts the top surface 51a as mentioned earlier. One or more additional insulation layers and conductive layers may be formed above the top electrode 54 to complete the MRAM structure 40.

The advantages of the second embodiment are similar to those realized in the first embodiment. A high MR performance is achieved by integrating an α-TaN seed layer in the MTJ element without concerns about growth inconsistency associated with a conventional Ta seed layer.

Figure 8:
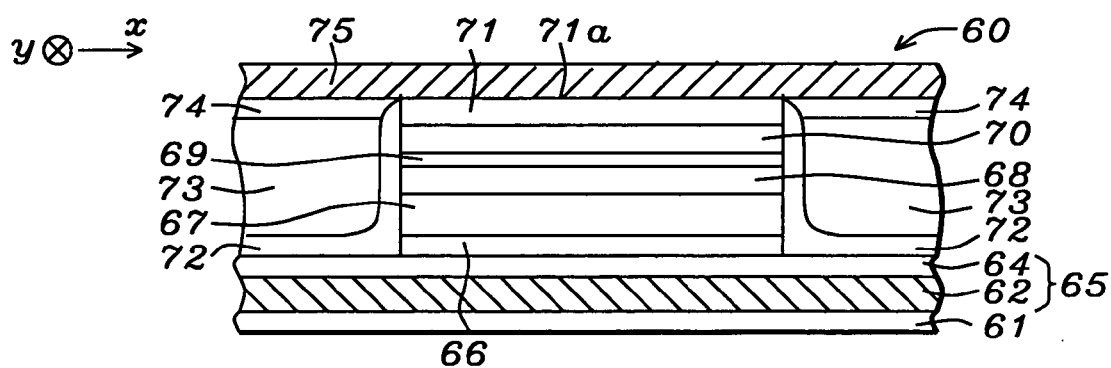
FIG. 8 is a cross-sectional view of a TMR read head in which an MTJ element is formed on a bottom shield according to a third embodiment of the present invention.

In a third embodiment depicted in FIG. 8, a magnetoresistive (MR) read head 60 hereafter referred to as a TMR read head is shown in which an MTJ element is formed between a bottom shield (S1) 65 and a top shield (S2) 75. An α-TaN layer is incorporated as a capping layer in the bottom shield. Although the MTJ element in the exemplary embodiment has a bottom spin valve configuration, the present invention also applies to an MTJ element with a top spin valve structure.

A substrate 61 is provided that may be AlTiC, for example. An important feature is that a bottom shield 65 which is a composite layer having a NiFe/α-TaN configuration is formed on the substrate 61. The main portion of the bottom shield 65 is a magnetic layer 62 comprised of NiFe with a thickness of about 2 microns. There is an α-TaN capping layer 64 with a thickness of about 50 to 400 Angstroms formed on the magnetic layer 62 by a previously described method. The α-TaN capping layer is employed to promote a smooth and dense growth of layers in a subsequently formed MTJ element and has an advantage over a conventional Ta capping layer because of its oxidation resistance and ability to promote consistent growth in the overlying MTJ layers.

An MTJ stack of layers is now formed on the bottom shield 65 by conventional methods which are not described herein. In one aspect, the MTJ stack of layers is disposed on the bottom shield 65 by sequentially forming a seed layer, AFM layer, SyAP pinned layer, tunnel barrier layer, free layer, and a capping layer. The seed layer 66 has a thickness of about 40 to 100 Angstroms and is preferably comprised of NiCr with a Cr content of about 35 to 45 atomic % although NiFe or NiFeCr are also useful seed layers. Since the seed layer 66 is grown on an α-TaN capping layer 64, a smooth and dense <111> seed layer structure results. A smooth and dense seed layer 66 is critical for smooth and densely packed growth in subsequently formed MTJ layers. The AFM layer 67 is preferably made of MnPt with a thickness of 80 to 200 Angstroms or IrMn having a thickness from 50 to 100 Angstroms.

The SyAP pinned layer 68 preferably has an AP2/Ru/AP1 configuration. The AP2 layer is formed on the AFM layer 67 and is preferably comprised of CoFe with a composition of about 10 to 25 atomic % Fe and with a thickness of about 15 to 25 Angstroms. The magnetic moment of the AP2 layer is pinned in a direction anti-parallel to the magnetic moment of the AP1 layer. The slight difference in thickness between the AP2 and AP1 layers produces a small net magnetic moment for the SyAP pinned layer 68. Exchange coupling between the AP2 layer and the AP1 layer is facilitated by a coupling layer that is preferably comprised of Ru with a thickness of about 7.5 Angstroms. In one embodiment, the AP1 layer is comprised of CoFe with a composition of about 25 to 50 atomic % Fe and a thickness of about 20 to 30 Angstroms. Optionally, the AP1 layer is a composite layer that includes a thin (5 to 6 Angstrom thick) nano-oxide layer (NOL) such as FeTaO or CoFeO sandwiched between CoFe layers. The nano-oxide layer is employed to increase smoothness of the AP1 layer.

Above the SyAP pinned layer 68 is formed a thin tunnel barrier layer 69 which is an oxidized Al layer that is referred to as an AlO$_x$ layer. Initially, a 5 to 6 Angstrom thick Al layer is deposited on the SyAP pinned layer 68 and is subsequently oxidized by a natural oxidation (NOX) method or by an in-situ radical oxidation (ROX) as described previously. The resulting AlO$_x$ layer has a thickness of about 7 to 11 Angstroms and has excellent smoothness and uniformity because of the smooth and densely packed seed layer 66 grown on the α-TaN capping layer 64.

The free layer 70 formed on the tunnel barrier layer 69 is preferably a composite CoFe/NiFe layer in which a CoFe layer with a thickness of about 5 to 15 Angstroms is formed on the tunnel barrier layer 69 and a NiFe layer having a thickness between about 20 and 40 Angstroms is disposed on the CoFe layer. In one embodiment, the CoFe layer has a similar composition to the CoFe layers in the previously described AP1 layer and the NiFe layer has a Ni content of about 75 to 85 atomic %. The present invention also encompasses an embodiment in which a nano-oxide layer is formed between the CoFe and NiFe layers in the free layer 70.

There is a capping layer 71 having a Ru/Ta configuration formed on the free layer 70. Preferably, the Ru layer has a thickness of about 10 to 30 Angstroms and the overlying Ta layer has a thickness from about 100 to 250 Angstroms. Because of the integration of an α-TaN layer as the capping layer 64 in the bottom shield 65, each layer in the MTJ stack is smooth and has a densely packed crystal structure.

Thereafter, an MTJ element with sidewalls and a top surface 71a is fabricated by conventional means that may include a photoresist mask formation, IBE process, and photoresist lift-off sequence which are well known and not described herein. A first dielectric layer 72 made of $Al_2O_3$ with a thickness of about 100 to 150 Angstroms is deposited on the bottom shield 65 and along the sidewalls of the MTJ element by a chemical vapor deposition (CVD) or physical vapor deposition (PVD) method. Next, a hard bias layer 73 preferably having a TiW/CoCrPt/Ta configuration and a second $Al_2O_3$ dielectric layer 74 are sequentially deposited on the first dielectric layer 72. The hard bias layer has a thickness of about 200 to 400 Angstroms and the second dielectric layer has a thickness between about 150 and 250 Angstroms. A planarization step may be employed to make the second dielectric layer 74 coplanar with the top surface 71a after a photoresist mask (not shown) is removed. An upper shield 75 is disposed on the top surface 71a of the MTJ element and on the second dielectric layer 74. The upper shield 75 may be a composite layer such as Ta/NiFe as appreciated by those skilled in the art.

Compared to TMR read heads having a conventional Ta capping layer on the bottom shield, the present invention offers better reliability and more consistent performance because of the oxidation resistance and crystal growth uniformity provided by the α-TaN capping layer.

Figure 9:
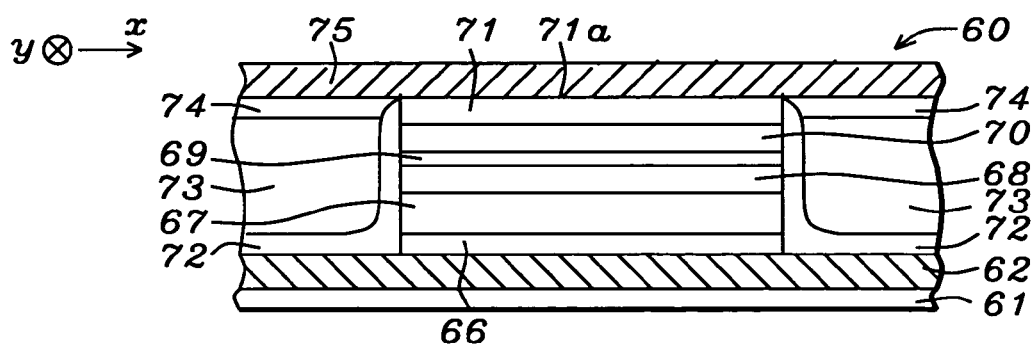
FIG. 9 is a cross-sectional view of a TMR read head in which the seed layer in an MTJ element is comprised of an α-TaN layer according to a fourth embodiment.

In a fourth embodiment depicted in FIG. 9, a TMR read head 60 is shown that has an MTJ element sandwiched between a bottom shield 62 and an upper shield 75. The TMR read head 60 is fabricated by a method similar to the process sequence previously described in the third embodiment. In this case, the bottom shield does not require a capping layer and the seed layer in the MTJ element is comprised of an α-TaN layer.

Referring to FIG. 9, the bottom shield 62 is preferably comprised of a NiFe and has a thickness of about 2 microns. Other bottom shield configurations that include a capping layer are acceptable although a capping layer for the bottom shield is not necessary in this embodiment. An MTJ stack of layers is disposed on the bottom shield 62 by sequentially forming a seed layer 66, AFM layer 67, SyAP pinned layer 68, tunnel barrier layer 69, free layer 70, and a capping layer 71. A key feature is that the seed layer 66 is comprised of an α-TaN layer as previously described. The α-TaN layer has a thickness of about 50 to 400 Angstroms and serves to promote a smooth and dense growth in overlying MTJ layers. One advantage of an α-TaN seed layer compared with a conventional Ta seed layer is that an α-TaN seed layer consistently provides smooth and dense growth in overlying MTJ layers while a Ta seed layer may be formed of different phases and is known to cause inconsistent growth in subsequently deposited MTJ layers.

Alternatively, the seed layer 66 may be a composite layer having a bottom α-TaN layer with a thickness from 50 to 300 Angstroms and an upper NiCr, NiFe, or NiFeCr layer having a thickness between about 40 and 100 Angstroms. In this case, the α-TaN in the seed layer 66 isolates the MTJ stack from the influence of the bottom shield 62.

The remaining layers in the MTJ stack have the same composition and thickness as described in the third embodiment. A top surface 71a is formed on the MTJ stack. Typically, the width of seed layer 66 is greater than the width of the capping layer 71. A first dielectric layer 72 is formed adjacent to the MTJ element and on the bottom shield as described earlier. Additionally, a hard bias layer 73 is formed on the first dielectric layer and a second dielectric layer 74 disposed on the hard bias layer is preferably coplanar with the top surface 71a as noted previously. There is an upper shield 75 formed on the second dielectric layer 74 which also contacts the top surface 71a.

The advantages of the fourth embodiment are the same as those realized in the third embodiment. A high performance device is achieved by integrating an α-TaN seed layer in the MTJ element without concerns about growth inconsistency associated with a conventional Ta seed layer. In particular, a high MR ratio (dR/R), high breakdown voltage, and acceptable RA are achieved when an α-TaN layer is used as a capping layer on a bottom shield in a TMR read head or as a seed layer in an MTJ element on the bottom shield.

While this invention has been particularly shown and described with reference to, the preferred embodiment thereof, it will be understood by those skilled in the art that various changes in form and details may be made without departing from the spirit and scope of this invention.

We claim:

1. A method of forming an MRAM structure on a substrate, comprising:
   (a) forming a bottom electrode that is comprised of a seed layer on a substrate, a Ru, Rh, or Ir conductive layer on the seed layer, and an α-TaN capping layer on the conductive layer wherein the capping layer forms a planar film;
   (b) forming an MTJ element comprised of a pinned layer/ tunnel barrier/free layer stack and having a top surface, bottom surface, and sidewalls, said bottom surface contacts a top surface of said capping layer in the bottom electrode; and
   (c) forming a top electrode on the top surface of the MTJ element.

2. The method of claim 1 wherein the α-TaN capping layer has a thickness of about 50 to 400 Angstroms and a nitrogen content between about 25 and 35 atomic %.

3. The method of claim 2 wherein said α-TaN capping layer is formed by a reactive sputtering process with a nitrogen containing plasma.

* * * * *